US008956883B1

(12) United States Patent
Hong (10) Patent No.: US 8,956,883 B1
(45) Date of Patent: Feb. 17, 2015

(54) MAGNETIC TUNNEL JUNCTIONS AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Zhongshan Hong, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/228,410

(22) Filed: Mar. 28, 2014

(30) Foreign Application Priority Data

Sep. 17, 2013   (CN) .......................... 2013 1 0425240

(51) Int. Cl.
*H01L 43/12*   (2006.01)
*H01L 43/02*   (2006.01)
*G11C 11/16*   (2006.01)

(52) U.S. Cl.
CPC .............. *H01L 43/02* (2013.01); *H01L 43/12* (2013.01); *G11C 11/161* (2013.01); *G11C 11/1673* (2013.01)
USPC ............................................................ 438/3

(58) Field of Classification Search
CPC ...... H01L 43/02; H01L 43/12; G11C 11/005; G11C 11/161; G11C 11/1673
USPC .......... 257/421; 438/3, 48, 591, 654; 365/158
See application file for complete search history.

(56) References Cited

U.S. PATENT DOCUMENTS

| | | | |
|---|---|---|---|
| 8,043,732 B2 * | 10/2011 | Anderson et al. .......... | 428/811.1 |
| 8,546,209 B1 * | 10/2013 | Cheng et al. ................... | 438/183 |
| 2008/0246104 A1 * | 10/2008 | Ranjan et al. ................. | 257/421 |
| 2011/0127626 A1 * | 6/2011 | Li et al. ......................... | 257/421 |
| 2013/0168864 A1 * | 7/2013 | Lee et al. ....................... | 257/753 |
| 2013/0221306 A1 * | 8/2013 | Nam et al. ......................... | 257/1 |
| 2013/0228892 A1 * | 9/2013 | Arai ............................... | 257/499 |
| 2013/0244344 A1 * | 9/2013 | Malmhall et al. ................. | 438/3 |
| 2013/0250661 A1 * | 9/2013 | Sandhu et al. ................. | 365/158 |

* cited by examiner

*Primary Examiner* — Nathan Ha
(74) *Attorney, Agent, or Firm* — Anova Law Group, PLLC (57) ABSTRACT

A method is provided for fabricating a magnetic tunnel junction. The method includes providing a substrate having a first dielectric layer and a first electrode layer formed in the first dielectric layer; and forming a composite magnetic layer on the first electrode layer and the first dielectric layer. The method also includes forming a first mask layer with a first shape and a second mask layer on a surface of the composite magnetic layer. Further, the method includes removing a portion of the first mask layer to form an opening; and forming a sidewall spacer on side surfaces of the first mask layer and the second mask layer in the opening. Further, the method also includes removing the second mask layer; and forming a composite magnetic structure having the first shape outer surface and a second shape inner surface by etching the composite magnetic layer.

15 Claims, 8 Drawing Sheets

MAGNETIC TUNNEL JUNCTIONS AND FABRICATION METHOD THEREOF

CROSS-REFERENCES TO RELATED APPLICATIONS

This application claims the priority of Chinese patent application No. 201310425240.1, filed on Sep. 17, 2013, the entirety of which is incorporated herein by reference.

FIELD OF THE INVENTION

The present invention generally relates to the field of semiconductor manufacturing technology and, more particularly, relates to magnetic tunnel junctions and fabrication techniques thereof.

BACKGROUND

Magnetic random access memory (MRAM) promises fast reading/writing, high density, non-volatility and low power consumption, thus it is suitable for the information-processing instrument, such as computers, or cell phones, etc.; and has attracted extensive attentions.

The existing MRAM includes transistors configured as switches, and magnetic tunnel junction (MTJ) structures configured to store data. The basic concept of the MRAM is to apply a magnetic field to store information in MTJ structures; and to read the stored information by measuring the current in the MTJ structures.

Figure 1:
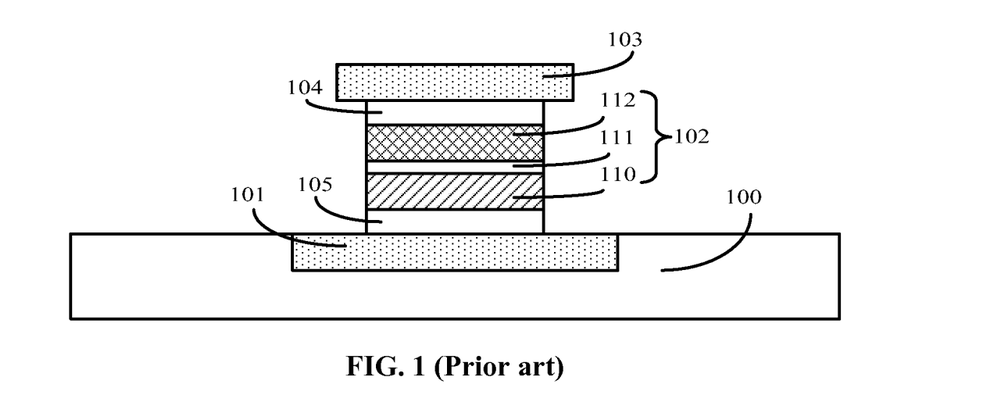
FIG. 1 illustrates an existing magnetic tunnel junction.

FIG. 1 illustrates an existing MTJ structure. The MTJ structure includes a substrate 100, a bottom electrode 101 formed on the substrate 100, a magnetic structure 102 formed on the bottom electrode 101 and a top electrode 103 formed on the magnetic structure 102. The magnetic structure 102 includes a fixed magnetic layer 110, a tunnel insulation layer 111 formed on the fixed magnetic layer 110 and a free magnetic layer 112 formed on the tunnel insulation layer 111. The magnetic structure 102 includes at least three layers. Further, the MTJ structure also includes a first dielectric layer 104 between the free magnetic layer 112 and the top electrode 103; and a second dielectric layer 105 between the fixed magnetic layer 110 and the bottom electrode 101.

The magnetization direction of the fixed magnetic layer 110 is fixed; and the magnetization direction of the free magnetic layer 112 is programmable. When the magnetization direction of the free magnetic layer 112 is same as the magnetization direction of the fixed magnetic layer 110, the resistance of the MTJ structure is minimum, thus the MTJ structure is at the logic "0" state. When the magnetization direction of the free magnetic layer 112 has a 180° phase difference with the magnetization direction of the fixed magnetic layer 110, the resistance of the MTJ structure is maximum, thus the MTJ structure is at the logic "1" state. During a data reading process, the state of the MRAM is read by obtaining the resistance of the MTJ structure.

However, the storing performance of such MTJ structure may be unstable, and the reliability of the MRAM may be relatively low. The disclosed device structures and methods are directed to solve one or more problems set forth above and other problems.

BRIEF SUMMARY OF THE DISCLOSURE

One aspect of the present disclosure includes a method for fabricating a magnetic tunnel junction. The method includes providing a substrate; and forming a first dielectric layer on the substrate. The method also includes forming a first electrode layer in the first dielectric layer on the substrate; and forming a composite magnetic layer on the first electrode layer and the first dielectric layer. Further, the method includes forming a first mask layer with a first shape on the composite magnetic layer; and forming a second mask layer on a surface of the composite magnetic layer and a side surface of the first mask layer. Further, the method also includes removing a portion of the first mask layer to form an opening crossing the first mask layer; and forming a sidewall spacer on side surfaces of the first mask layer and the second mask layer in the opening. Further, the method also includes removing the second mask layer; and forming a ring shape composite magnetic structure having a first shape outer surface and a second shape inner surface by etching through the composite magnetic material layer, wherein the first shape is different from the second shape so as to control thickness between the outer surface and the inner surface.

Another aspect of the present disclosure includes a magnetic tunnel junction. The magnetic tunnel junction includes a substrate; and a first dielectric layer formed on a surface of the substrate. The magnetic junction also includes a first electrode layer formed in the first dielectric layer on the surface of the substrate. Further, the magnetic tunnel junction includes a ring shape composite magnetic structure with a first shape outer surface and a second shape inner surface formed on the first electrode layer and the first dielectric layer, wherein the first shape is different from the second shape so as to control thickness between the outer surface and the inner surface.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
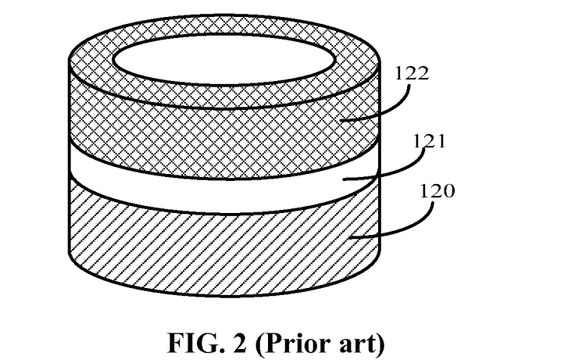
FIG. 2 illustrates a three dimensional structure of the magnetic structure of an annular magnetic tunnel junction structure.

In order to improve the data storage performance and to reduce noise and increase storage capacity, an annular magnetic tunnel junction (MTJ) structure has been developed. FIG. 2 illustrates a three-dimensional structure of the magnetic structure of the annular MTJ structure.

As shown in FIG. 2, the magnetic structure of the circular MTJ structure includes a fixed magnetic layer 120, a tunnel insulation layer 121 formed on the first magnetic layer 120 and a free magnetic layer 122 formed on the tunnel insulation layer 121. The fixed magnetic layer 120, the tunnel insulation layer 121 and the free magnetic layer 122 are all circular rings. That is, the inner side surfaces and the outer side surfaces of the fixed magnetic layer 120, the tunnel insulation layer 121 and the free magnetic layer 122 are all circular or cylindrical.

However, the magnetic field reversal of the circular ring free magnetic layer 122 of the annular MTJ structure may be unstable; and an automatic magnetic field reversal may happen. Thus, the magnetic direction reversal of the free magnetic layer 122 may be unstable; and the storage ability of the MTJ structure may be unable to match design requirements.

Figure 3:
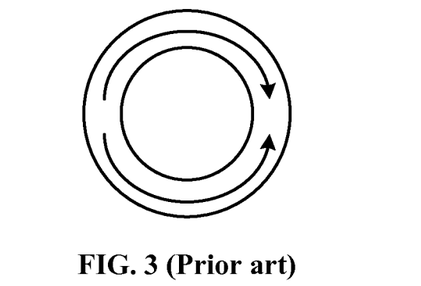
FIG. 3 illustrates a magnetic field direction reversal matching a design requirement.
Figure 4:
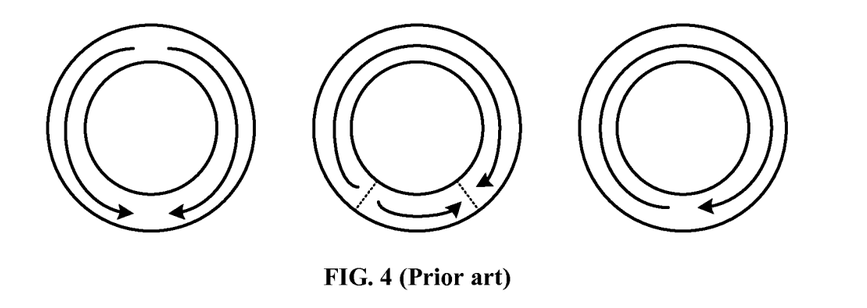
FIG. 4 illustrates a magnetic field direction reversal not matching the design requirement

Specifically, FIG. 3 illustrates a magnetic field direction reversal matching a design requirement. However, because the magnetic field reversal of the circular ring free magnetic layer 122 of the annular MTJ structure may be unstable, which may cause the magnetic field to flip to one of the directions shown in FIG. 4, which may not match the design requirement (the middle image, not symmetrical); or the magnetic field may automatically flip when the magnetic field reversal is not required (the right image). Thus, the storage performance of the MTJ structure may be unstable. The disclosed device structures and methods are directed to solve the unstable issue by forming a magnetic tunnel structure with a circular outer surface and an elliptical inner surface.

Figure 21:
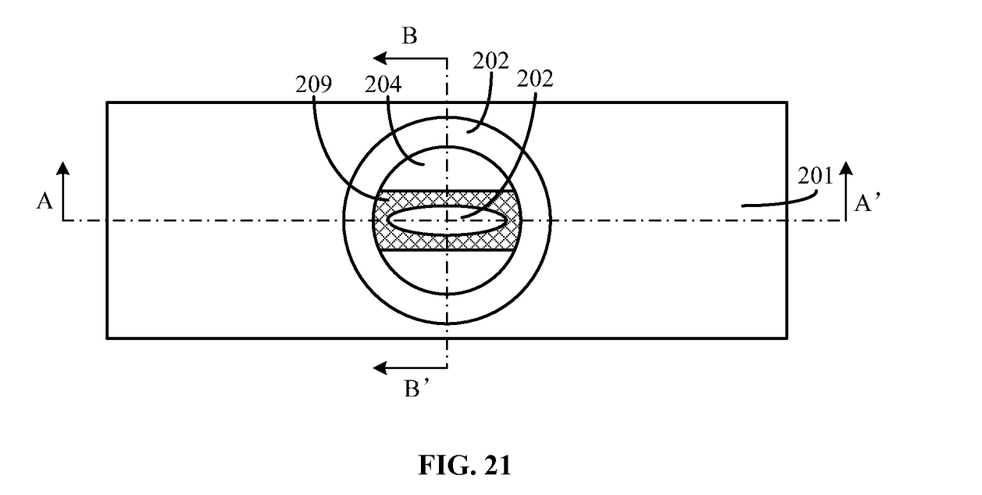
Figure 22:
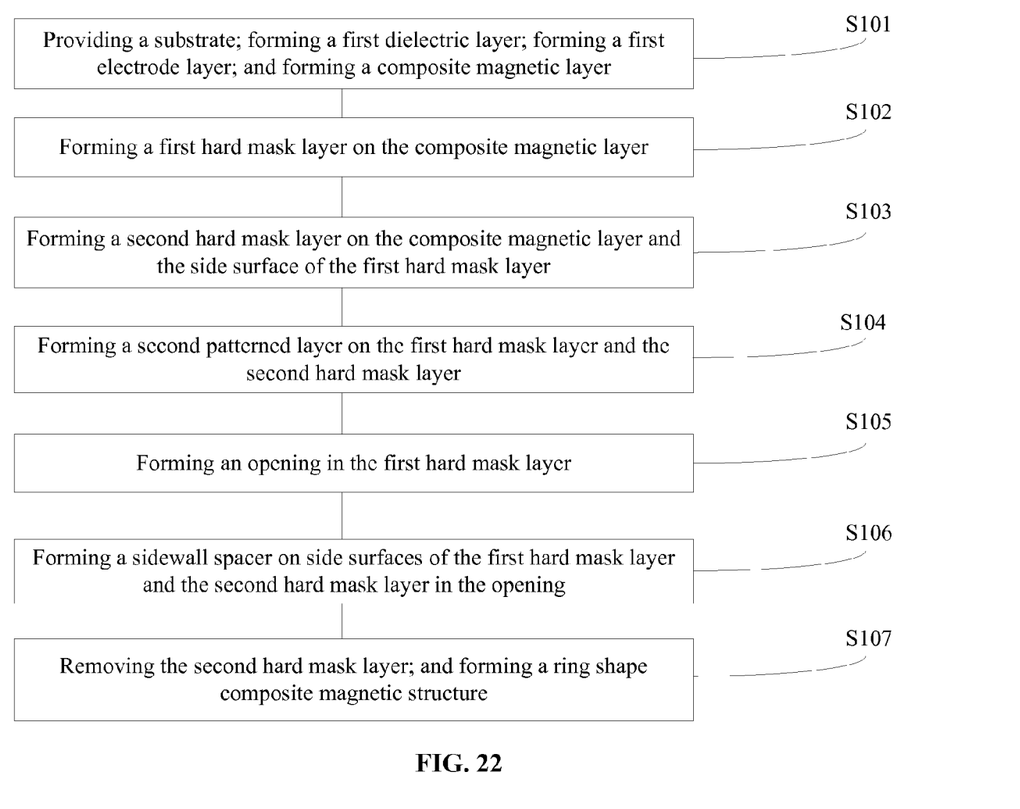
FIG. 22 illustrates an exemplary fabrication process of a magnetic tunnel junction consistent with the disclosed embodiments.

FIG. 22 illustrates an exemplary fabrication process of an MTJ structure; and FIGS. 5~21 illustrate exemplary semiconductor structures corresponding to various stages of the fabrication process.

Figure 5:
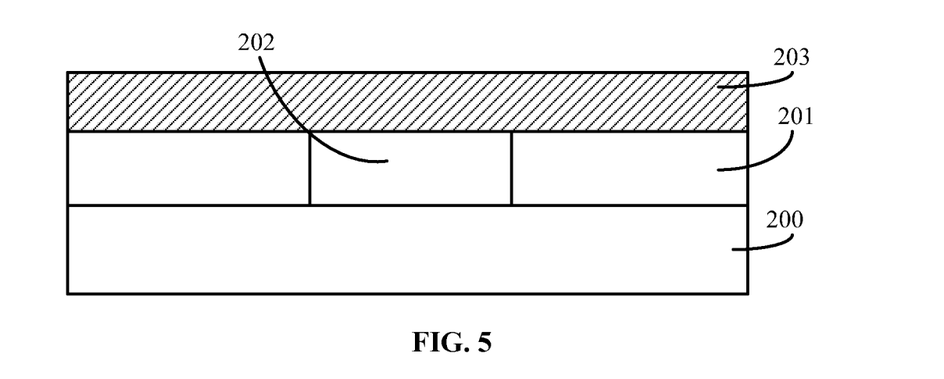
FIGS. 5~21 illustrate semiconductor structures corresponding to certain stages of an exemplary fabrication process of a magnetic tunnel junction consistent with the disclosed embodiments.

As shown in FIG. 22, at the beginning of the fabrication process, a substrate with certain structures is provided (S101). FIG. 5 illustrates a corresponding semiconductor structure.

As shown in FIG. 5, a substrate 200 is provided. A first dielectric layer 201 may be formed on one surface of the substrate 200. A first electrode layer 202 may be formed in the first dielectric layer 201; and the first dielectric layer 201 may expose the first electrode layer 202. Further, a composite magnetic layer 203 may be formed on the surfaces of the first dielectric layer 201 and the first electrode layer 202.

The substrate 200 may include a semiconductor substrate, a plurality of semiconductor devices formed in the semiconductor substrate, a plurality of conductive structures configured to connect the semiconductor devices and/or a plurality of the dielectric layers configured to isolate the semiconductor devices and the conductive structures. Some other devices may be included in the substrate 200; and some devices may be omitted.

The semiconductor substrate may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, alloy semiconductor, or glass etc. The semiconductor substrate provides a base for subsequent processes and structures.

The semiconductor devices may include transistors, diodes, resistors, MEMS, or other appropriate devices. In one embodiment, the semiconductor devices are transistors. The first electrode layer 202 may electrically connect with the transistors. The transistors may be configured to drive the subsequently formed MTJ structure to achieve data reading and/or data writing in the MTJ structure.

The first electrode layer 202 may be configured as a bottom electrode of the MTJ structure. In one embodiment, the first electrode layer 202 may electrically connect with the transistors; and the first electrode layer 202 may be used to send signals to the transistors; and/or receive signals from the transistors, thus the first electrode layer 202 may be made of a material with a relatively high conductivity, such as Ta, PtMn, or Ru, etc. The first electrode layer 202 may also be made of Cu, W, or Al, etc.

A process for forming the first electrode layer 202 may include forming a first electrode material layer on the surface of the substrate 200; and followed by etching the first electrode material layer into desired patterns. The first electrode material layer may be formed by any appropriate processes, such as a chemical vapor deposition (CVD) process, a physical vapor deposition (PVD) process, an atomic layer deposition (ALD) process, a flowable chemical vapor deposition (FCVD) process, an electroplating process, or a sputtering process, etc. The first electrode layer 202 may be etched by a dry etching process, a wet etching process, or an ion beam etching process, etc.

In certain other embodiments, the first electrode layer 202 may be formed by a lift-off process. Specifically, the lift-off process may include forming a patterned photoresist layer exposing a portion of the substrate 200 corresponding to the position of the first electrode layer 202 on the substrate 200; forming the first electrode material layer on the patterned photoresist layer and the portion of the substrate 200 exposed by the photoresist layer; and removing the photoresist layer and the first electrode material layer on the photoresist layer. Thus the first electrode layer 202 may be formed.

The first dielectric layer 201 may be made of any appropriate material, such as one or more of silicon oxide, silicon nitride, silicon oxynitride, etc.

In one embodiment, a process for forming the first dielectric layer 201 may include forming a first dielectric material layer on the surface of the substrate 200 and the first electrode layer 202; and polishing the first dielectric material layer until the first electrode layer 202 is exposed, thus the first dielectric layer 201 may be formed.

Various processes may be used to form the first dielectric material layer, such as a CVD process, a PVD process, or an FCVD process, etc. The polishing process may include a chemical mechanical polishing (CMP) process, or a mechanical polishing process, etc.

In certain other embodiments, the first dielectric layer 201 may be formed firstly; then an opening corresponding to the shape and the position of the first electrode layer 202 may be formed in the first dielectric layer 201; and followed by filling the opening with the first electrode layer 202.

The composite magnetic layer 203 may include at least one magnetic layer (not labeled). When the composite magnetic layer 203 includes a plurality of magnetic layers, a first insulation layer (not shown) may be formed between adjacent magnetic layers.

The composite magnetic layer 203 may include a fixed magnetic layer (not labeled), a magnetic insulation layer (not labeled) formed on the fixed magnetic layer and a free magnetic layer (not labeled) formed on the magnetic insulation layer. The magnetic insulation layer may be used to insulate the fixed magnetic layer and the free magnetic layer. The fixed magnetic layer may have a fixed magnetization direction. The magnetization direction of the free magnetic layer may be programmable.

The fixed magnetic layer may be made of any appropriate material, such as CoFe, or CoFeB, etc. The free magnetic layer may be made of any appropriate material, such as CoFe, or CoFeB, etc. The magnetic insulation layer may be made of any appropriate material such as MgO, SrO, BaO, or RuO, etc.

Various processes may be used to form the fixed magnetic layer, the free magnetic layer and the magnetic insulation layer, such as a CVD process, a PVD process, an FCVD process, or a sputtering process, etc.

In one embodiment, the composite magnetic layer 203 may also include a second electrode layer (not labeled) formed on the top surface of the composite magnetic material layer 203. The second electrode layer may be configured as the top electrode of the MTJ structure. The second electrode layer may be used to send signals to external circuits; and/or receive signals from external circuits. Thus, the second electrode layer may be made of a material with a relatively high conductivity, such as Ta, PtMn, or Ru, etc. The second electrode layer may also be made of Cu, W, or Al, etc.

In certain other embodiments, the composite magnetic layer 203 may not have the second electrode layer, after subsequently etching the composite magnetic layer 203 to form a composite magnetic structure, the second electrode layer may be subsequently formed on the top surface of the composite magnetic structure.

In one embodiment, the composite magnetic layer 203 may be directly formed on the surface of the first electrode layer 202, thus the first electrode layer 202 may apply a bias voltage on the composite magnetic layer 203. In certain other embodiments, the composite magnetic layer 203 may also include a second dielectric layer (not shown) between the first electrode layer 202 and the composite magnetic layer 203 and a third dielectric layer (not shown) between the second electrode layer and the composite magnetic layer 203. The second dielectric layer and the third dielectric layer may be able to adjust the tunnel voltage between the first electrode layer 202 and the second electrode layer.

Figure 6:
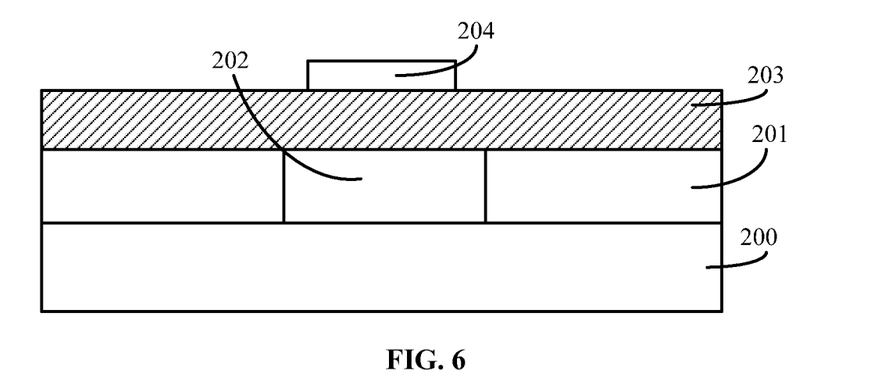
Figure 7:
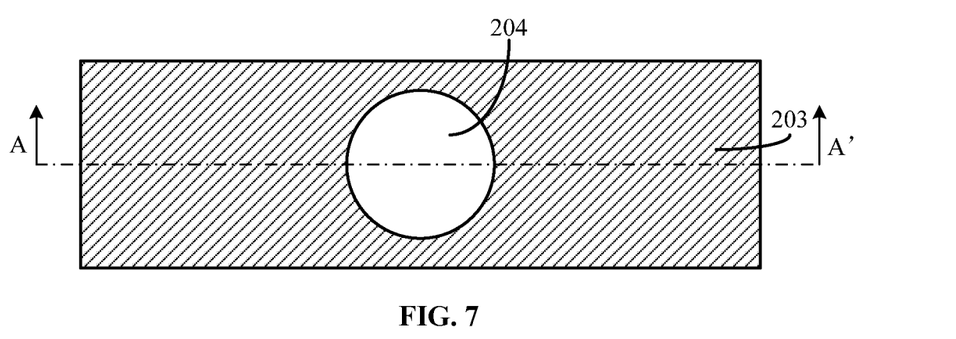

Returning to FIG. 22, after providing the substrate 200 with the first dielectric layer 201, the first electrode layer 202 and the composite magnetic layer 203, a first hard mask layer may be formed (S102). FIGS. 6~7 illustrate a corresponding semiconductor structure. FIG. 6 is a cross-section view of the semiconductor structure illustrated in the FIG. 7 along the AA' direction.

As shown in FIGS. 6~7, a first hard mask layer 204 is formed on the composite magnetic layer 203. A projection view of the first hard mask layer 204 onto the surface of the substrate 200 may be referred as a first shape. In one embodiment, the first shape may be a circle or a cylinder. Other appropriate shapes may also be used. For illustrative purposes, the circular first dielectric layer 204 may be used in the descriptions. Further, the position of the first mask layer 204 may correspond to the position of the first electrode layer 202.

The first hard mask layer 204 may define the shape of the outer side surface of a subsequently formed composite magnetic structure. Because the shape of the first hard mask layer 204 may be circular, the outer side surface of the subsequently formed composite magnetic structure may also be circular. The position of the first hard mask layer 204 may correspond to the position of the first electrode layer 202, thus the composite magnetic structure formed by subsequently etching the composite magnetic layer 203 using the first mask layer 204 as an etching mask may electrically connect with the first electrode layer 202. The first electrode layer 202 may send signals to the composite magnetic structure; and/or receive signals from the composite magnetic structure.

The diameter of the first hard mask layer 204 may be referred as a first size. In one embodiment, the first size may be in a range of approximately 50 nm~150 nm.

The first hard mask layer 204 may be made of any appropriate material, such as silicon nitride, silicon oxynitride, silicon oxide, titanium nitride, amorphous carbon, poly silicon, or amorphous silicon, etc. In one embodiment, the first hard mask layer 204 is made of silicon nitride.

A process for forming the first hard mask layer 204 may include forming a first hard mask material layer (not shown) on the composite magnetic layer 203; and forming a first patterned layer (not shown) on the first mask material layer. The pattern on the first patterned layer may be a circle; and the position of the pattern may correspond to the position of the first electrode layer 202. Further, after forming the first patterned layer, the first hard mask material layer may be etched using the first patterned material layer as an etching mask until the composite magnetic layer 203 is exposed, thus the first hard mask layer 204 may be formed. After forming the first hard mask layer 204, the first patterned layer may be removed.

The first patterned layer may be made of any appropriate material, such as silicon oxide, silicon nitride, silicon oxynitride, or photoresist, etc. In one embodiment, the first patterned layer is made of photoresist.

Various processes may be used to form the first patterned layer, such as a CVD process, a PVD process, an FCVD process, or a spin-coating process, etc.

The first hard mask material layer may be etched by any appropriate process, such as a dry etching process, a wet etching process, or an ion beam etching process, etc. In one embodiment, the first hard mask material layer is etched by an anisotropic dry etching process.

The first patterned layer may be removed by any appropriate process, such as a dry etching process, a wet etching process, or a plasma ashing process, etc.

Figure 8:
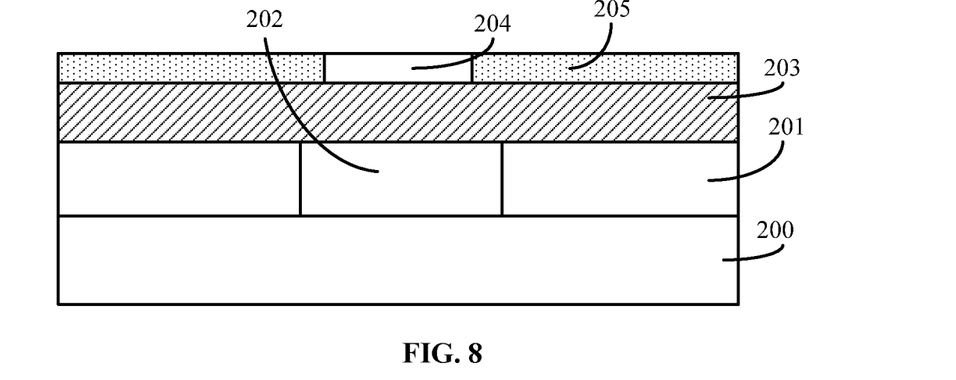
Figure 9:
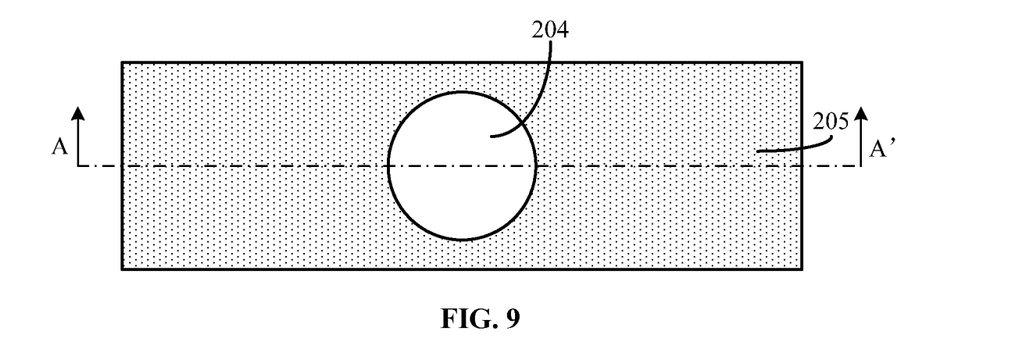

Returning to FIG. 22, after forming the first hard mask layer 204, a second hard mask layer may be formed (S103). FIGS. 8~9 illustrate a corresponding semiconductor structure. FIG. 8 is a cross-section view of the semiconductor structure illustrated in FIG. 9 along the AA' direction.

As shown in FIGS. 8~9, a second hard mask layer 205 is formed on the surface of the composite magnetic layer 203 and the side surface of the first hard mask layer 204. The surface of the second hard mask layer 205 may level with the surface of the first hard mask layer 204.

The second hard mask layer 205 may be used to keep the circular shape of the first hard mask layer 204, when an opening crossing the circular first hard mask layer 204 is subsequently formed, the second hard mask layer 205 may still keep the circular shape. Thus, it may ensure that a sidewall spacer subsequently formed on the side surfaces of the first hard mask layer 204 and the second hard mask layer 205 may have a circular shape. Therefore, the outer side surface of a structure formed by subsequently etching the first hard mask layer 204 may also have a circular or cylindrical shape.

The second hard mask layer 205 may be made of any appropriate material, such as silicon nitride, silicon oxynitride, silicon oxide, titanium nitride, amorphous carbon, or amorphous silicon, etc. In one embodiment, the second hard mask layer 205 is made of silicon oxide. The second hard mask layer 205 may be made of a material different from the first hard mask layer 204, so that the first hard mask layer 204 and the second hard mask layer 205 may have a relatively high etching selective ratio. When the opening is subsequently formed in the first hard mask layer 204, the morphology of the second hard mask layer 205 may not be affected.

A process for forming the second hard mask layer 205 may include forming a second hard mask material layer on the surface of the composite magnetic layer 203 and the first hard mask layer 204; and polishing the second hard mask material layer until the surface of the first hard mask layer 204 is exposed. Thus, the second hard mask layer 205 may be formed.

The second hard mask material layer may be formed by any appropriate process, such as a CVD process, a PVD process, or an FCVD process, etc. The second hard mask material layer may be polished by a CMP process, or a mechanical polishing process, etc.

Figure 10:
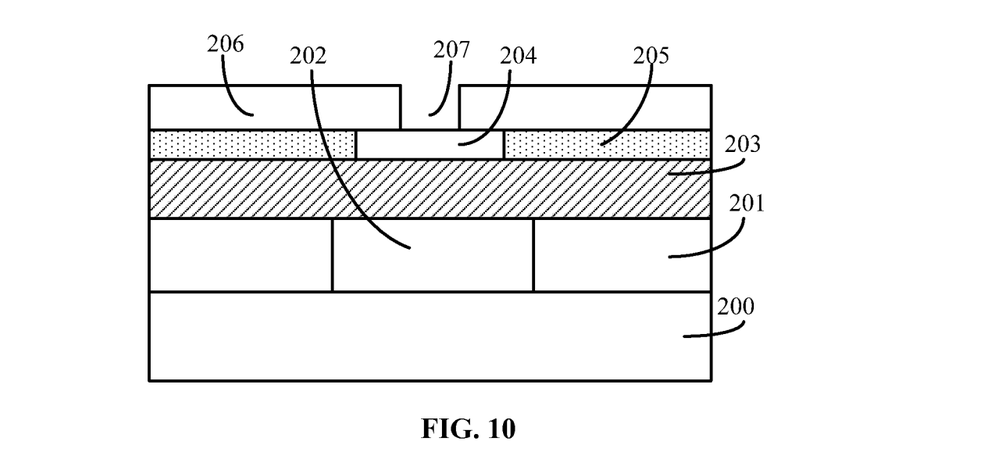
Figure 11:
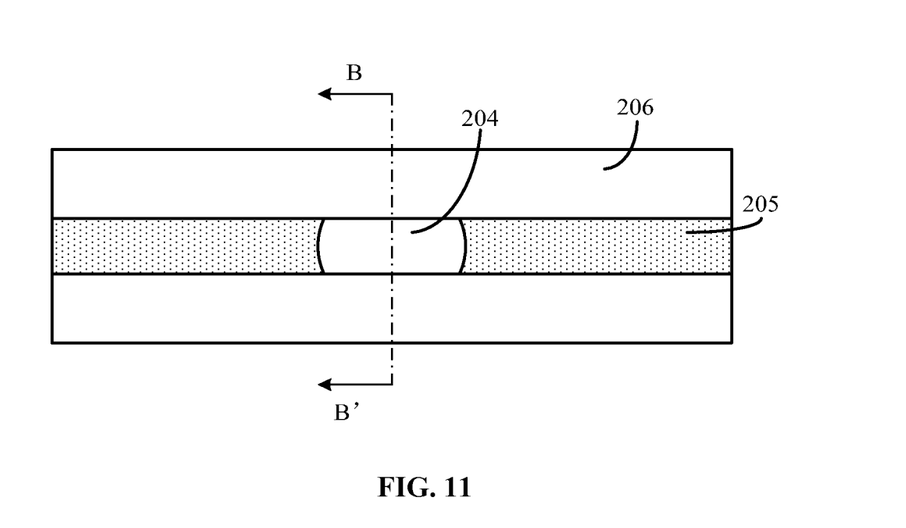

Returning to FIG. 22, after forming the second hard mask layer 205, a second patterned layer may be formed (S104). FIGS. 10~11 illustrate a corresponding semiconductor structure. FIG. 10 is a cross-section view of the semiconductor structure illustrated in FIG. 10 along the BB' direction.

As shown in FIGS. 10~11, a second patterned layer 206 is formed on the first hard mask layer 204 and the second hard mask layer 205. The second patterned layer 206 may have a trench 207. The trench 207 may expose a portion of the first hard mask layer 204 and a portion of the second hard mask layer 205. A projection of view of the trench 207 on the surface of the substrate 207 may be a stripe; the strip may cross the circular pattern of the first hard mask layer 204.

The second patterned layer 206 may define the position of the subsequently formed opening in the first mask layer 204. The width of the trench 207 may be referred as a second size. The second size may be approximately $1/5$~$1/3$ of the first size. That is, the width of the trench 207 may be smaller than the diameter of the first hard mask layer 204. Such a width may cause the second patterned layer 206 at both sides of the trench 207 to cover two portions of the first hard mask layer 204. After subsequently etching the first hard mask layer 204 using the second patterns layer 206 with the trench 207 as an etching mask, the two portions of the first hard mask layer 204 may be kept at both sides of the formed opening; and the other two sides of the opening may expose two portions of the second hard mask layer 205. Thus, after subsequently forming a sidewall spacer on the side surfaces of the first hard mask layer 204 and the second hard mask layer 205 in the opening, an eclipse having a short axis and a long axis may be formed from the opening.

The second patterned layer 206 may expose the center of the circular first hard mask layer 204. That is, the stripe of the trench 207 may at least cover one diameter of the circular shape of the first hard mask layer 204. Thus, the difference between the two portions of the first mask hard layer 204 at both sides of the trench 207 may be relatively small, after subsequently forming the sidewall spacer in the opening; the opening may be more symmetrical. Therefore, the magnetic reversal of a composite magnetic structure formed by the first mask layer 204 and the sidewall spacer may be more stable. In one embodiment, the center axis of the trench 207 may overlap with the diameter of the circular shape of the first hard mask layer 204, thus the sizes of the two portions of the first hard mask layer 204 at both sides of the trench 207 may be same. Such size arrangements may aid the subsequently formed composite magnetic structure to be more symmetrical.

The second patterned layer 206 may be made of any appropriate material, such as silicon oxide, silicon nitride, or silicon oxynitride, or photoresist, etc. In one embodiment, the second patterned layer 206 is made of photoresist.

Various processes may be used to form the trench 207 in the second patterned layer 206. In one embodiment, if the second patterned layer 206 is made of photoresist, the trench 207 may be formed by directly patterning the photoresist. In certain other embodiments, if the second patterned layer 206 is made of other material, the trench 207 may be formed by etching the second patterned layer 206.

Figure 12:
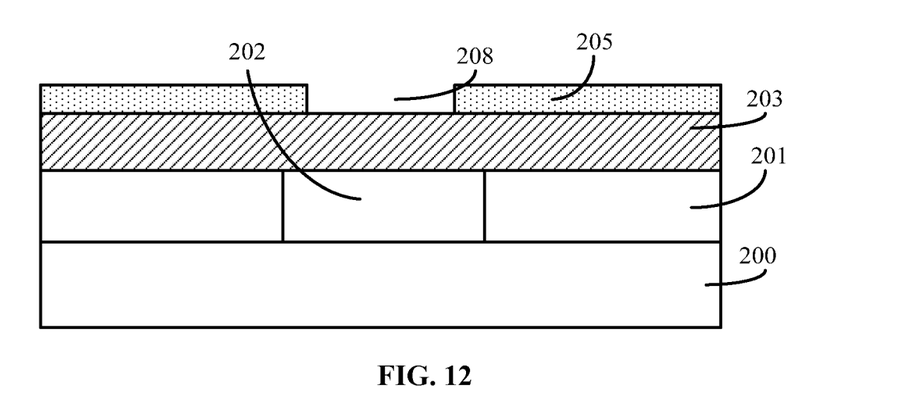
Figure 13:
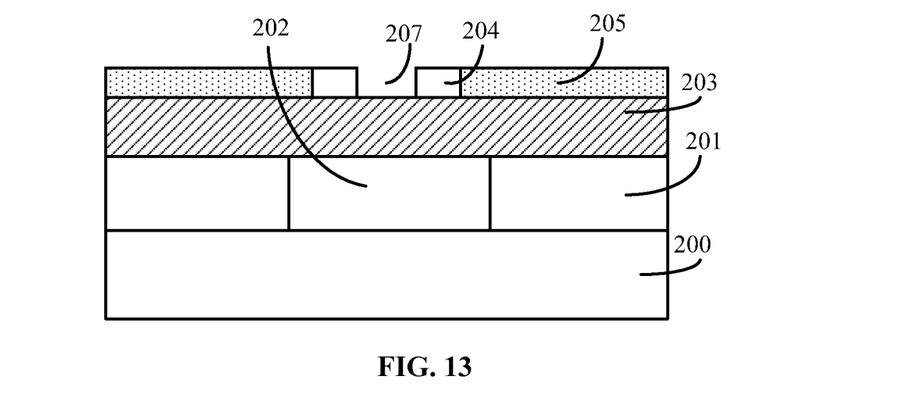
Figure 14:
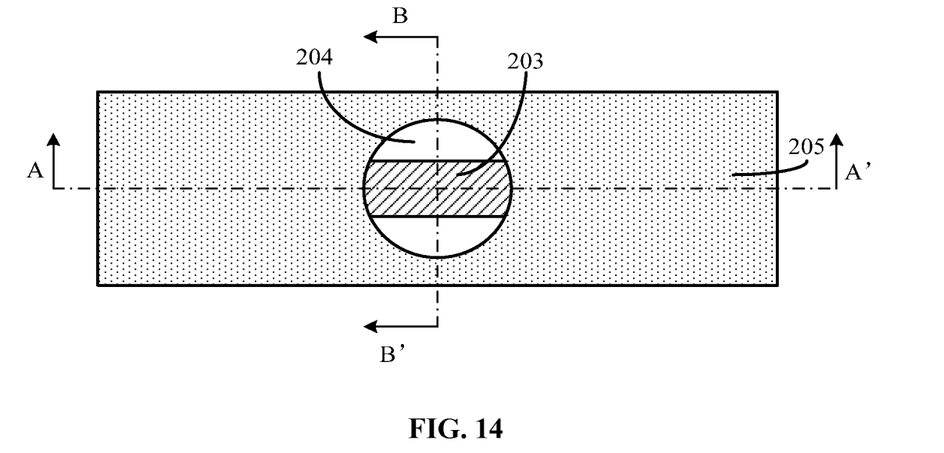

Returning to FIG. 22, after forming the second patterned layer 206, an opening may be formed (S105). FIGS. 12~14 illustrate a corresponding semiconductor structure. FIG. 12 is a cross-section view of the semiconductor structure illustrated in FIG. 14 along the AA' direction; and FIG. 13 is a cross-section view of the semiconductor structure illustrate in FIG. 14 along the BB' direction.

As shown in FIGS. 12~14, an opening 208 is formed in the first hard mask layer 204 and the second hard mask layer 205. The opening 208 may be formed by etching the first hard mask layer 204 using the second patterned layer 206 as an etching mask until the composite magnetic layer 203 is exposed, thus the opening 208 is formed in the first hard mask layer 204 and the second hard mask layer 205. A projection view of the opening 208 on the surface of the substrate 200 is a stripe with two round ends. The two round ends are two portions of the circular interface between the first hard mask layer 204 and the second hard mask layer 205. The stripe of the opening 208 may cross the circular shape of the first hard mask layer 204. After forming the opening 208, the second patterned layer 206 may be removed.

When the first hard mask layer 204 is etched using the second patterned layer 206 as an etching mask, because the first hard mask layer 204 and the second hard mask layer 205 may be made of different materials having an etching selective ratio, the second hard mask layer 205 may not be damaged. Therefore, after forming the opening 208 crossing the circular shape of the first hard mask layer 204, the second hard mask layer 205 may be able to keep the circular shape of the first mask layer 204. The two round ends of the opening 208 may expose side surfaces of the two portions of the second hard mask layer 205. The straight edges of the opening 208 may expose side surfaces of the first hard mask layer 204. After subsequently formed sidewall spacers on the exposed side surfaces of the first hard mask layer 204 and the second hard mask layer 205, a sidewall spacer with an elliptical shape may be formed by following the shape of opening 208. The ellipse may have a short axis and a long axis vertical to the short axis.

Various processes may be used to etch the first hard mask layer 204, such as a dry etching process, a wet etching process, or an ion beam etching process, etc. In one embodiment, an anisotropic dry etching process is used to etch the first hard mask layer 204 to form the opening 208. The side surfaces of the opening 208 may be perpendicular to the surface of the composite magnetic layer 203. Since the opening 208 is formed by the etching the first hard mask layer 204 using the second patterned layer 206 as an etching mask, the width of the opening 208 (critical dimension) may be the second size. That is, the width of the opening 208 may be approximately $1/5$~$2/3$ of the first size.

Because the second patterned layer 206 may expose the center of the circular shape of the first hard mask layer 204; and the stripe of the trench 207 may at least cover one diameter of the circular shape of the first hard mask layer 204, a projection view of the opening 208 on the surface of the substrate 200 may also be a stripe. The stripe of the opening 208 may also cover the center of the circular shape of the first hard mask layer 204, thus the stripe of the opening 208 may cover at least one diameter of the circular shape of the first hard mask layer 204. Therefore, the difference between the two portions of the first hard mask layer 204 at both sides of the opening 208 may be relatively small; and the magnetic field reversal of the subsequently formed composite magnetic structure may be more stable. In one embodiment, the center axis of the opening 208 may overlap with the diameter of the circular shape of the first hard mask layer 204, thus the sizes of the two portions of the first hard mask layer 204 at both sides of the opening 208 may be same. Such sizes may aid the subsequently formed composite magnetic structure to be more symmetrical.

Various processes may be used to remove the second patterned layer 206, such as dry etching process, or a wet etching process, etc. In one embodiment, the second patterned may be made of photoresist, a plasma ashing process is used to remove the second patterned layer 206.

Figure 15:
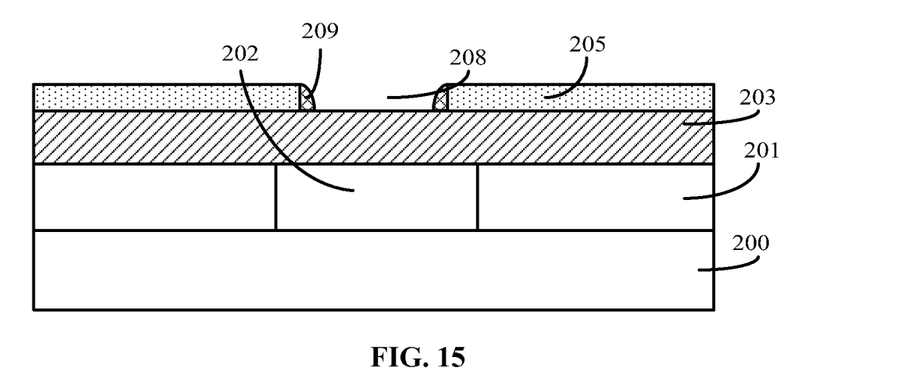
Figure 16:
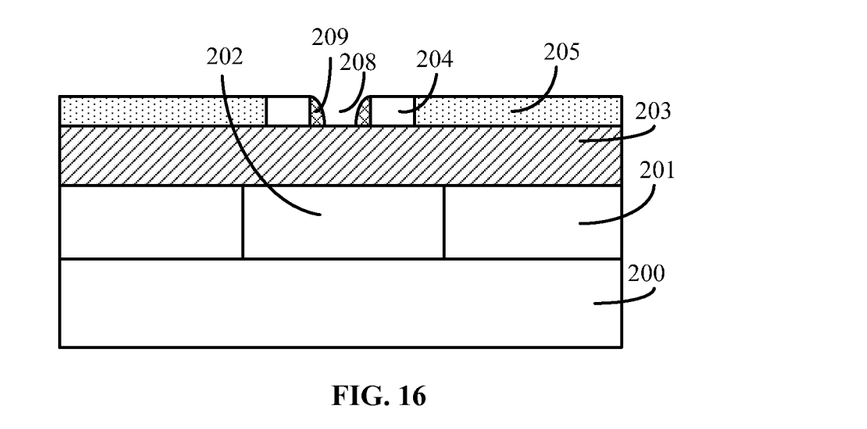
Figure 17:
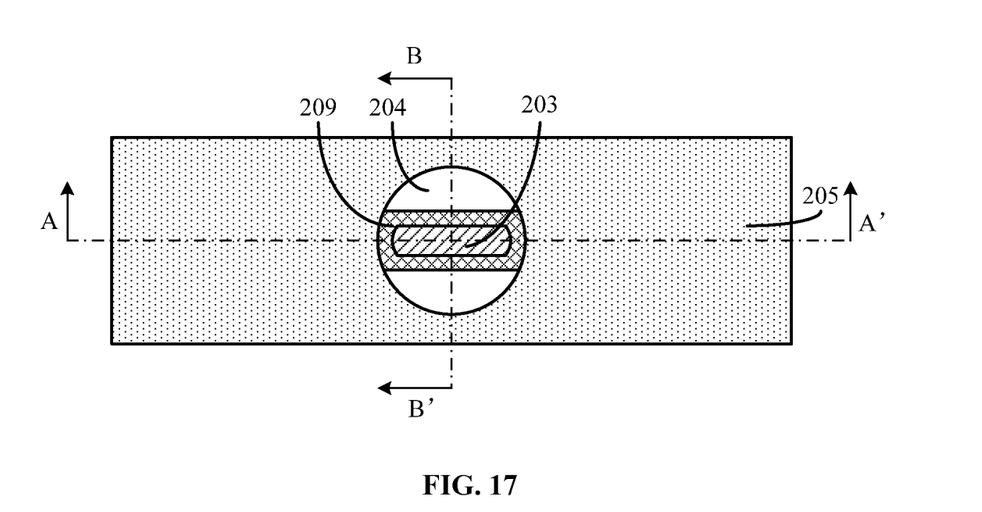

Returning to FIG. 22, after forming the opening 208, a sidewall spacer may be formed (S106). FIGS. 15~17 illustrate a corresponding semiconductor structure. FIG. 15 is a cross-section view of the semiconductor structure illustrated in FIG. 17 along the AA' direction; and the FIG. 16 is a cross-section view of the semiconductor structure illustrated in FIG. 17 along the BB' direction.

As shown in FIGS. 15~17, a sidewall spacer 209 (may referred as a third hard mask layer) is formed on the side surfaces of the first hard mask layer 204 and the second hard mask layer 205 in the opening 208. The sidewall spacer 209 and the first hard mask layer 204 may together be used as an etching mask for subsequently etching the composite magnetic layer 203 to form a composite magnetic structure.

A process for forming the sidewall spacer 209 may include forming a sidewall spacer material layer (not shown) on the surfaces of the first hard mask layer 204 and the second hard mask layer 205 and the side surfaces and the bottom surface of the opening 208; and performing an etch back process onto the sidewall spacer material layer until the surfaces of the first hard mask layer 204 and the second mask layer 205 and the bottom surface of the opening 208 are exposed, thus the sidewall spacer 209 may be formed on the side surfaces of the first mask layer 204 and the second mask layer 205 in the opening 208.

The sidewall spacer 209 may be made of a material different from the first hard mask layer 204 and the second hard mask layer 205, thus when the etch back process is performed, the surfaces of the first mask layer 204 and the second mask layer 205 may not be damaged. The sidewall spacer material layer may be made of any appropriate material, such as silicon nitride, silicon oxynitride, silicon oxide, titanium nitride, amorphous carbon, poly silicon, or amorphous silicon, etc. In one embodiment, the sidewall spacer 209 is made of amorphous carbon.

The thickness of the sidewall spacer material layer may determine the thickness of the sidewall spacer 209. In one embodiment, the thickness of the sidewall spacer 209 may be in a range of approximately 5 nm~50 nm.

Various processes may be used to form the sidewall spacer material layer, such as a CVD process, a PVD process, or an FCVD process, etc. In one embodiment, the sidewall spacer material layer is formed by a CVD process. The sidewall spacer material layer formed by a CVD process may have a uniform thickness. That is, the thickness of the sidewall spacer 209 on the side surface of the first hard mask layer 204 and the thickness of the sidewall spacer 209 on the second hard mask layer 205 may be same. Portions of the composite magnetic structure subsequently formed by an etching process using the sidewall spacer 209 on the side surface of the second hard mask layer 205 as an etching mask may have a relatively small thickness. Portions of the composite magnetic structure subsequently formed by an etching process using the sidewall spacer 209 formed on the side surface of the first hard mask layer 204 and the first hard mask layer 204 as an etching mask may have a relatively large thickness. For the entire composite magnetic structure, the portions of the magnetic structure having the relatively small thickness may determine the direction of the magnetic field reversal. The uniform thickness of the sidewall spacer 209 may cause the portions of the composite magnetic structure having the relatively small thickness to have a uniform thickness too. Thus, the magnetic field reversal of the subsequently formed composite magnetic structure may be more stable; the performance of the MTJ structure may be stable; and the reliability of the MTJ structure may be improved.

Figure 18:
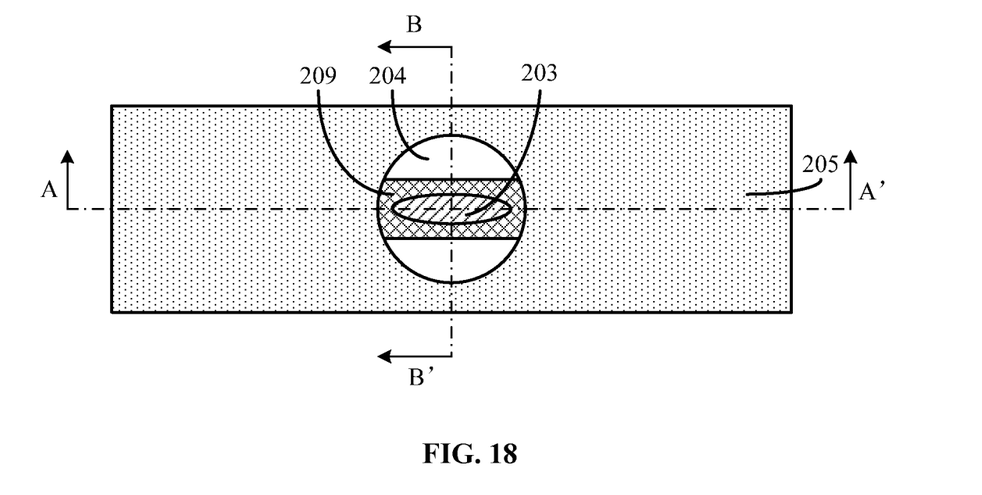

Optionally and additionally, after forming the sidewall spacer 209, a thermal annealing process may be performed when the sidewall spacer 209 is made of a spin on glass (SOG) material or a phosphosilicate glass (PSG) material, etc. FIG. 18 illustrates a corresponding semiconductor structure.

Because SOG or PSG may be at a semi-melting state under a high temperature, during the thermal annealing process, the sidewall spacer 209 made of SOG or PSG may have a certain degree of reflow, as shown in FIG. 18, the surface of the sidewall spacer 209 may become smoother; and the opening 208 of the sidewall spacer 209 may be more like an ellipse. The composite magnetic structure subsequently formed by an etching process using the sidewall spacer 209 as an etching mask may have a better inner surface morphology.

The temperature of the thermal annealing process may be in a range of approximately 300° C.~500° C. The environment gas of the thermal annealing process may include any appropriate non-oxygen gas, such as nitrogen, hydrogen, or inert gas, etc.

Figure 19:
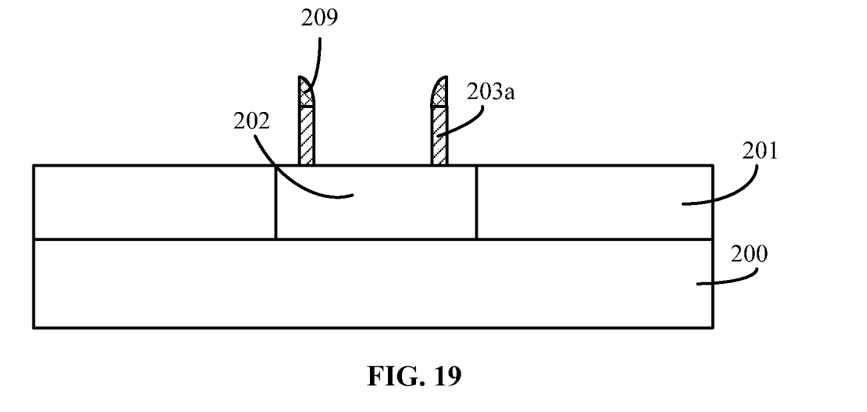
Figure 20:
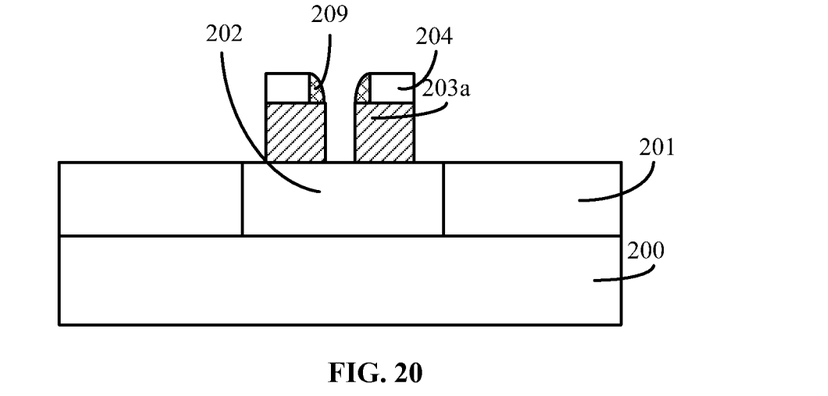

Returning to FIG. 22, after forming the sidewall spacer 209, the second hard mask layer 205 may be removed; and a composite magnetic structure may be formed (S107). FIGS. 19~21 illustrate a corresponding semiconductor structure. FIG. 19 is a cross-section view of the semiconductor structure illustrated in FIG. 21 along the AA' direction; and FIG. 20 is a cross-section view of the semiconductor structure illustrated in FIG. 21 along the BB' direction.

As shown in FIGS. 19~21, the second hard mask layer 205 is removed; and the composite magnetic structure 203a is formed by etching the composite magnetic layer 203 using the sidewall spacer 209 and the first hard mask layer 204 as an etching mask until the surface of the first electrode layer 202 is exposed.

Various processes may be used to remove the second hard mask layer 205, such as a dry etching process, or a wet etching process, etc. Because the second mask layer 205, the first hard mask layer 204 and the sidewall spacer 209 may be made of different materials, when the second hard mask layer 205 is removed, the first hard mask layer 204 and the sidewall spacer 209 may not be damaged. In one embodiment, the second hard mask layer 205 may be removed by a wet etching process. The wet etching process may completely remove the second hard mask layer 205 with a relatively fast speed. Various appropriate chemicals may be used for the wet etching process, in one embodiment, when the second mask layer 205 is made of silicon oxide; the chemical for the wet etching process is hydrogen fluoride.

Various processes may be used to etch the composite magnetic layer 203 to form the composite magnetic structure 203a, such as a dry etching process, a wet etching process, or an ion beam etching process, etc. In one embodiment, an ion sputter dry etching process is used to etch the composite magnetic layer 203. Because the composite magnetic layer 203 may include at least a fixed magnetic layer, a magnetic insulation layer and a free magnetic layer; and the fixed magnetic layer or the free magnetic layer may be made of alloy materials including multiple types of metals, the composition of the composite magnetic layer 203 may be rather complex. The ion sputter dry etching process may be able to reduce the etching selectivity of different materials in the composite magnetic layer 203, thus the magnetic structure 203a may have a desired morphology after the ion sputter dry etching process.

The etching gas of the ion sputter dry etching process may include hydrogen, carbon, nitrogen, or inert gases, such as $CH_4$, $NH_3$, $N_2$, Ar, or $H_2$, etc. The etching gas may be unable to react with the composite magnetic layer 203. That is, the etching gas may only bombard the composite magnetic layer 203 with a physical manner. Thus, the desired morphology of the magnetic structure 203a may be ensured.

After etching the composite magnetic layer 203, the formed composite magnetic structure 203a and the first electrode layer 202 may together form the MTJ structure; the MTJ structure may be used to form a MRAM. In one embodiment, the composite magnetic layer 203 may include a second electrode layer, thus the composite magnetic structure 203a formed by etching the composite magnetic layer 203 may be the entire MTJ structure. In certain other embodiments, if the composite magnetic layer 203 does not include the second electrode layer, after forming the composite magnetic structure 203a, a second electrode layer may be formed on the composite magnetic structure 203a to form the MTJ structure.

Thus, the composite magnetic structure 203a may have a ring shape. The projection view of the outer surface of the ring shape on the surface of the substrate 200 may be circular; and the circular shape may be defined by the shape of the first hard mask layer 204. The projection view of the inner surface of the ring shape on the surface of the substrate 200 may be elliptical. The ellipse may have a long axis and a short axis perpendicular to the long axis. The ellipse may be defined by the inner side surface of the sidewall spacer 209. Because the outer surface of the composite magnetic structure 203a may be circular and the inner surface of the composite magnetic structure 203a may be elliptical, the magnetic field reversal of the composite magnetic structure 203a may be more stable. Thus, the stability of the MTJ structure having such a composite magnetic structure may be enhanced; and the performance of the MRAM having such an MTJ structure may be improved.

Further, because the outer surface of the composite magnetic structure 203a may be circular; and the inner surface of the composite magnetic structure 203a may be elliptical, portions of the composite magnetic structure 203a may be relative thin; and portions of the composite magnetic structure 203a may be relatively thick. The relatively thin portions of the composite magnetic structure 203a may determine the direction of the magnetic field reversal. The relatively thin portions of the composite magnetic structure 203a may be formed by etching the composite magnetic layer 203 using the sidewall spacer 209 as an etching mask. Since the thickness of the sidewall spacer 209 may be relatively uniform, the thickness of the relatively thin portions of the composite magnetic structure 203a may be uniform too. Thus, by controlling the thickness difference, the direction of the magnetic field reversal can be controlled and the stability of the magnetic field reversal of the composite magnetic structure 203a may be further improved.

Referring to FIGS. 19~21, after forming the composite magnetic structure 203a, the sidewall spacer 209 and the first hard mask layer 204 may be removed. A second dielectric layer (not shown) may be formed on the surface of the first dielectric layer 201 and the side surfaces of the composite magnetic structure 203a to electrically insulate the composite magnetic structure 203a.

The sidewall spacer 209 and the first hard mask layer 204 may be removed by any appropriate process, such as a dry etching process, or a wet etching process, etc.

The second dielectric layer may be formed by any appropriate process, such as a CVD process, a PVD process, or an FCVD process, etc.

Thus, a magnetic tunnel junction (MTJ) may be formed by the above disclosed processes and methods; and a corresponding magnetic tunnel junction is illustrated in FIGS. 19~21. The magnetic tunnel junction includes a substrate 200; and a first dielectric layer 201 formed on the surface of the substrate 200. The magnetic junction structure also includes a first electrode layer 202 formed in the first dielectric layer 201 on the surface of the substrate 200. Further, the magnetic junction structure includes a ring shape composite magnetic structure 203a having a circular outer surface and an elliptical inner surface formed on the surface of the first electrode layer 202 and the surface of the first dielectric layer 202. Further, the magnetic tunnel junction also includes a second electrode (not shown) formed on the surface of the composite magnetic structure 203a. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a magnetic tunnel junction, comprising:
   providing a substrate;
   forming a first dielectric layer on the substrate;
   forming a first electrode layer in the first dielectric layer on the substrate;
   forming a composite magnetic layer on the first electrode layer and the first dielectric layer;
   forming a first hard mask layer with a first shape on the composite magnetic layer;
   forming a second mask layer on a surface of the composite magnetic layer and a side surface of the first hard mask layer;
   removing a portion of the first hard mask layer to form an opening crossing the first hard mask layer;
   forming a sidewall spacer on side surfaces of the first hard mask layer and the second hard mask layer in the opening;
   removing the second hard mask layer; and
   forming a composite magnetic structure having the first shape outer surface and a second shape inner surface by etching through the composite magnetic material layer, wherein the first shape is different from the second shape so as to control thickness between the outer surface and the inner surface.

2. The method according claim 1, wherein:
   the first shape is a circle;
   the second shape is an ellipse; and
   a projection view of the opening on the substrate is a stripe.

3. The method according to claim 1, after forming the composite magnetic structure, further including:
   removing the first hard mask layer and the sidewall spacer.

4. The method according to claim 1, wherein:
the composite magnetic layer includes at least one magnetic layer having a fixed magnetic layer, a free magnetic layer and a magnetic insulation layer between the fixed magnetic layer and the free magnetic layer.

5. The method according to claim 4, wherein:
when the composite magnetic layer is a multiple-layered structure, a first insulation layer is formed between adjacent composite magnetic layers.

6. The method according to claim 4, wherein:
the composite magnetic layer includes a second dielectric layer formed on the free magnetic layer, a second electrode layer formed on the second dielectric layer and a third dielectric layer formed between the fixed magnetic layer and the first electrode layer.

7. The method according to claim 6, after removing the sidewall spacer and the first mask layer, further including:
forming a second electrode layer on the second dielectric layer.

8. The method according to claim 1, after forming the sidewall spacer, further including:
performing a thermal annealing process to cause sidewall spacer material to reflow and smooth the sidewall spacer.

9. The method according to claim 1, wherein:
the first hard mask layer, the second hard mask layer and the sidewall spacer are made of different materials;
the first hard mask layer is made of silicon nitride, silicon oxynitride, silicon oxide, titanium nitride, amorphous carbon, or amorphous silicon;
the second hard mask layer is made of silicon nitride, silicon oxynitride, silicon oxide, titanium nitride, amorphous carbon, or amorphous silicon; and
the sidewall spacer is made of silicon nitride, silicon oxynitride, silicon oxide, titanium nitride, amorphous carbon, or amorphous silicon.

10. The method according to claim 8, wherein:
the sidewall spacer is made of a spin on glass (SPG) material or phosphorous silicon glass (PSG).

11. The method according to claim 1, wherein:
a critical dimension of the opening is approximately $1/5 \sim 2/3$ of a critical dimension of the first mask layer.

12. The method according to claim 8, wherein:
an environmental gas of the thermal annealing process is one of nitrogen, hydrogen or inert gas; and
a temperature of the thermal anneal process is in a range of approximately 300° C.~500° C.

13. The method according to claim 8, wherein:
a thickness of the sidewall spacer formed on the side surface of the first hard mask layer and a thickness of the sidewall spacer formed on the side surface of the second hard mask layer are same; and
the thickness of the sidewall spacer is in a range of approximately 5 nm~50 nm.

14. The method according to claim 1, wherein forming the opening further includes:
forming a patterned layer having a trench exposing the first hard mask layer and the second hard mask layer on the first hard mask layer and the second hard mask layer;
etching the first hard mask layer using the patterned layer as an etching mask until the composite magnetic layer is exposed; and
removing the patterned layer.

15. The method according to claim 1, wherein forming the sidewall spacer further includes:
forming a sidewall spacer material layer on surfaces of the first hard mask layer and the second hard mask layer, side surfaces of the opening and the bottom surface of the opening; and
performing an etch back process on the sidewall spacer material layer until the surfaces of the first hard mask layer and the second hard mask layer and the bottom surface of the opening are exposed.

* * * * *